United States Patent [19]

Burford

[11] 4,238,836
[45] Dec. 9, 1980

[54] FAIL SAFE MAGNETIC BUBBLE MEMORY

[75] Inventor: Thomas M. Burford, Summit, N.J.

[73] Assignee: Bell Telephone Laboratories, Incorporated, Murray Hill, N.J.

[21] Appl. No.: 18,310

[22] Filed: Mar. 7, 1979

[51] Int. Cl.³ .............................................. G11C 19/08
[52] U.S. Cl. ........................................ 365/12; 365/15; 365/36
[58] Field of Search ...................................... 365/12, 15

[56] References Cited

U.S. PATENT DOCUMENTS

| | | | |
|---|---|---|---|
| 3,744,042 | 7/1973 | Cutler | 365/30 |
| 3,838,407 | 9/1974 | Juliussen | 365/15 |
| 3,879,585 | 4/1975 | Bobeck et al. | 365/15 |

Primary Examiner—James W. Moffitt
Attorney, Agent, or Firm—Herbert M. Shapiro

[57] ABSTRACT

The familiar G-shaped, non-closed, major path in a major-minor, magnetic bubble memory is formed controllably into a closed circumferential major loop about the minor loops during operation. A simple data format allows a simple start-up algorithm to ensure that data are secured.

5 Claims, 3 Drawing Figures

FAIL SAFE MAGNETIC BUBBLE MEMORY

FIELD OF THE INVENTION

This invention relates to magnetic bubble memories, and more particularly to a bubble memory operative in a major-minor mode. The basic major-minor, magnetic bubble memory is disclosed in P. I. Bonyhard, U.S. Pat. No. 3,618,054 issued Nov. 10, 1969. The memory is disclosed in terms of a field-access type magnetic bubble memory in which a magnetic field rotates in the plane of bubble movement. The rotating field generates magnetic field gradients by magnetizing, for example, a pattern of magnetically soft elements in a plane adjacent the plane of bubble movement. As the field rotates, different patterns of field gradients are generated. The pattern of elements is repetitive and designed to provide for the appearance of gradients in successive positions along a path. The bubble patterns follow the gradients and thus the paths defined by the pattern of elements. The elements also could comprise, for example, ion-implanted regions and recesses in the bubble layer.

More recently, "field"-access type operation has been achieved in response to current pulses impressed in an electrically—conducting layer having apertures. The term "field access" in this context is intended to characterize the provision of a uniform drive (here a current drive) which the driven portion (the conductor layers) of the propagation implementation couples (via apertures in the layers) to the bubble pattern.

The major-minor organization requires that a number of the paths be formed into closed loops about which bubble patterns circulate in parallel in response to the drive field. The closed loops are termed minor loops and associated data bits in the loops are moved through reference locations one after the other by the successive cycles of the drive field. A master clock, keeping track of the number of cycles of the drive field and returning to zero each time the number of cycles equals the number of stages in the minor loops, indicates the address of the associated bits in the reference locations.

A major (path or) loop is also formed. The major loop includes an input port and a detector at which a bubble pattern is generated or detected respectively. In either case, a bubble pattern occupies successive (or alternative) stages of the major loop. These stages are associated with the reference locations mentioned hereinbefore. Bubble patterns are removed from the minor loops by a transfer operation which leaves vacancies behind in the minor loops. Alternatively, a replication operation occurs which leaves the orginal pattern in the minor loops and a replica of that pattern in the major loop either operation occuring at the reference locations. Fail safe operation is not a problem when replication is employed so we will direct our attention hereinafter only to bubble memories including a transfer operation at transfer gates, located at the reference locations for moving bubble patterns between the major and minor loops. Although replication gates are available, they require more voltage and current than transfer gates and so limit the capacity or performance of bubble chips in many instances.

U.S. Pat. No. 3,838,407 of J. E. Juliussen issued Sept. 24, 1974 describes a major-minor organization for a bubble memory which includes a non-closed G-shaped major path which we will not refer to as a loop because it cannot operate to recirculate information. The shape of the G-shape path is intended to allow information to be transferred out at one end of the minor loops and to be transferred in at the other end of the minor loops by movement along a single major path where the bubble pattern (data) passes both sets of ends of the minor loops in like order. Improved data rates result because previously addressed data need not be cleared from the major path before new data is accessed as was previously the case. Also, only undirectional transfer gates are necessary.

BRIEF DESCRIPTION OF THE INVENTION

Bubble memories with G-shaped major paths are made fail safe herein by forming the major path into a loop. Bubble patterns in a major loop are associated with specific addresses for starting the memory when power is restored. An address tag is added to the data in each address and the tag and the data are bracketed by two bubbles (binary one). In this manner, a power failure can, at worst, result only in the addressed data occupying positions in a major loop where it can be recovered after power is restored. Thus, a magnetic bubble memory herein comprises a layer of material in which magnetic bubbles can be moved and a pattern of elements for defining a plurality of minor loops with first and second ends and a major loop operative to move bubbles past the first and second ends in like order.

DETAILED DESCRIPTION

Figure 1:
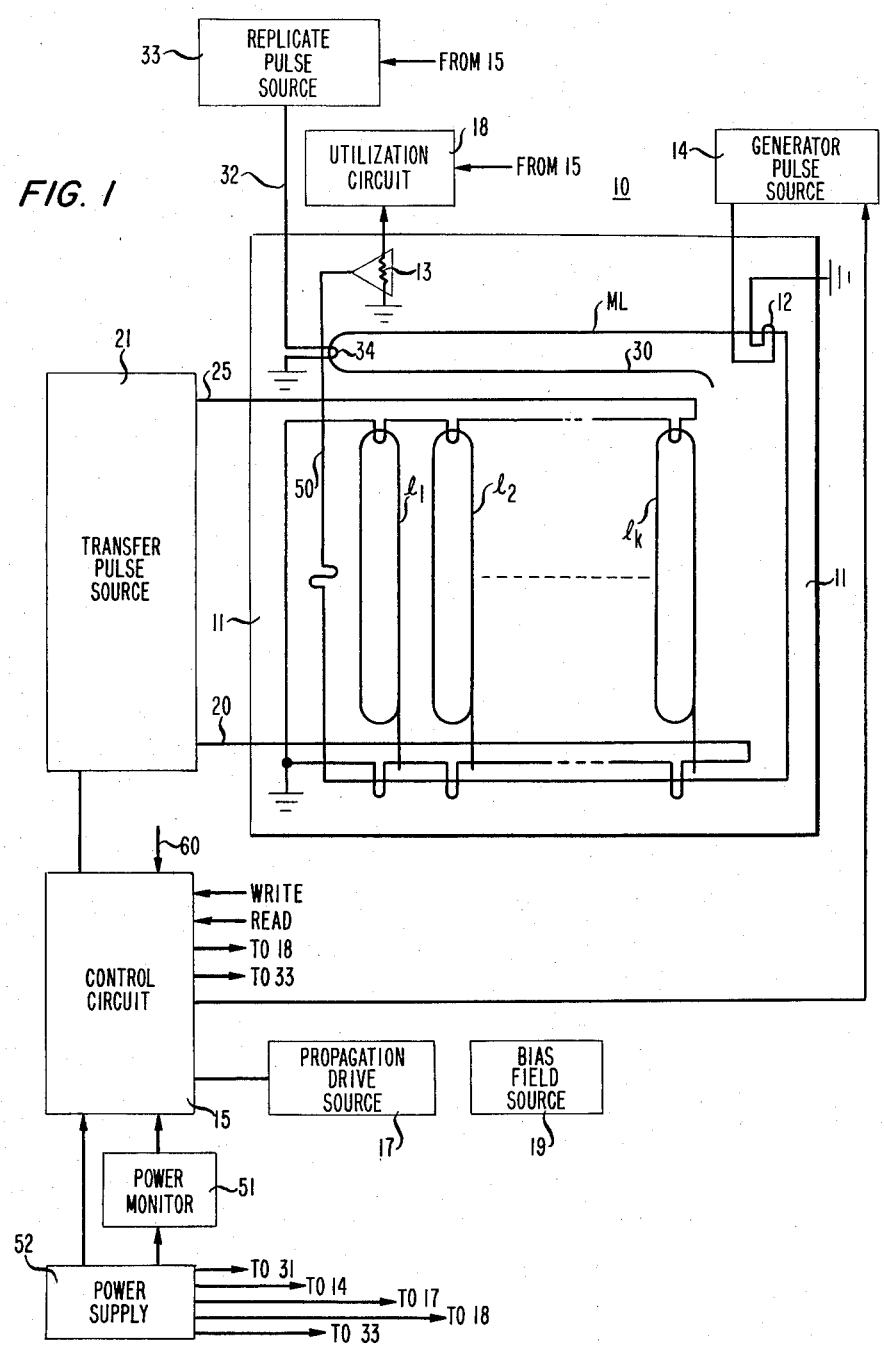
FIG. 1 is a schematic representation of a magnetic bubble memory in accordance with the invention.

FIG. 1 shows a magnetic bubble memory 10 including a host layer 11 of a material in which magnetic bubbles can be moved. Bubbles are moved in layer 11 in closed loops, $l_1, l_2 \ldots$ and $l_k$ which are commonly referred to as minor loops and what may be thought of as a single loop ML commonly referred to as a major loop. In the illustrative embodiment, loop ML is folded into the G-shaped configuration mentioned hereinbefore.

Permanent storage of data is provided by the minor loops. The major loop, on the other hand, provides for access to the minor loops of substitute data from a bubble generator 12 and for read out of addressed data at detector 13. In this connection generator 12 comprises an electrical conductor connected between a generator pulse source 14 and ground operative under the control of control circuit 15 to provide a pulse selectively during each cycle of a propagate drive circuit represented by block 17. Detector 13 similarly is shown connected between a utilization circuit 18 and ground. Bubbles are maintained at a nominal diameter by a bias field supplied by source 19.

We will adopt the convention that data, generated at 12, move clockwise about loop ML to locations at the lower ends of minor loops $l_i$ in response to successive propagation cycles. A transfer-in conductor 20 couples those ends of the minor loops with associated stages of the major loop for transferring new data into the minor loops at the proper time. Conductor 20, to this end, is connected between a transfer pulse source 21 and ground as shown.

A similar transfer operation, termed a transfer-out operation occurs at the top ends of the minor loops as viewed. The transfer-out operation is controlled by a pulse in conductor 25 which is similarly connected between pulse source 21 and ground. The control of the transfer function as well as the generator, propagation, and detector operation is derived from a master clock in accordance with well understood principles. Such circuitry along with an address register is considered to be included within control circuit 15.

The transfer-out operation moves addressed data from the minor loops into an auxiliary (major) propagation path 30. Data in path 30 move from right to left as viewed passing a replicate port 34 and moving normally to detector 13. When the replicate port is operated, an image of the data moves into major loop ML. The replicate port is defined by conductor 32 connected to a replicate pulse source 33 and ground.

The general organization of the memory of FIG. 1 thus can be seen to involve the generation of a bubble pattern at 12 for later storage in the minor loops by the activation of transfer conductor 20 during a write operation. Also involved is the transfer-out of addressed data from the minor loops by the activation of transfer-out conductor 25. The data transferred out is replicated at 34 by the activation of conductor 32, the original (transferred) data advancing to detector 13 for applying signals representative of the replicated bubble pattern to utilization circuit 18. The replica of the data moves clockwise along the loop ML until a later transfer-in operation occurs. This later transfer-in operation moves the data back into vacancies at the bottom of the minor loops as viewed.

In this connection, it is helpful to recognize that bubbles usually are moving synchronously in all the loops of the memory. When a transfer-out operation occurs, vacancies are left in the addressed bit locations in the minor loops. Those vacancies move about the minor loops as the transferred data moves to detector 13 and the replica of that data moves in loop ML. The number of stages in the minor loops and the number in the major loop are chosen so that data transferred-out or data generated at 12 arrive at the lower end of the minor loops synchronously with those vacancies. It also should be recognized that the transfer-out of data into path 30 rather than directly into the major loop ensures that the bits so transferred are in the proper sequence for a later transfer-in operation much as the familiar G-shaped path operates. In the absence of path 30, the bits would be reversed thus necessitating, for example, a more complicated transfer-in operation. In any case, it is important to note that a read or write operation requires a following transfer-in operation. Particularly, in the case of a G-shaped, non-closed major path, data not so transferred-in are destroyed.

In the embodiment of FIG. 1, a portion 50 is added to major loop (actually path) ML. The portion merges into path 30 before replicator 34 at one end and may be thought of as a continuation of loop ML at the other end beyond the point where loop ML couples minor loop l₁. Data transferred out to path 30 move normally to detector 13. It may be appeciated that although path 30, major "path" (loop) ML and portion 50 can be seen to form a generally G-shaped major loop for data replicated at 34, data in path 30 or portion 50 may always move to detector 13 but is not always replicated. Thus, path 30, "loop" ML, and portion 50 may be thought of also as separate paths linked into a major loop during some operations.

Figure 2:
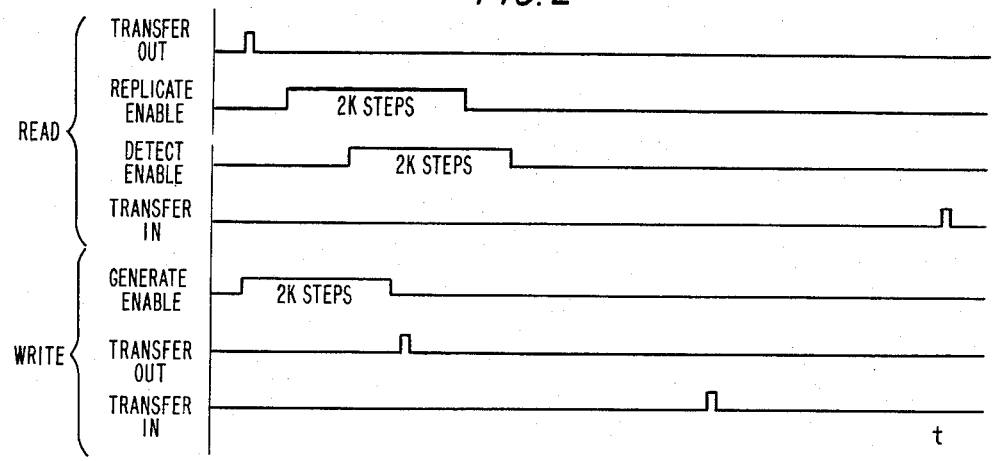
FIG. 2 is a pulse diagram of the operation of the memory of FIG. 1.

Normal operation is summarized by the pulse diagram of FIG. 2. A read operation can be seen to comprise of a transfer-out of the addressed data, by the activation of conductor 25 followed by a sequence of a number of replicate pulses at 34 equal to twice the number of minor loops, followed later by the activation of conductor 20 for a transfer-in operation.

Figure 3:
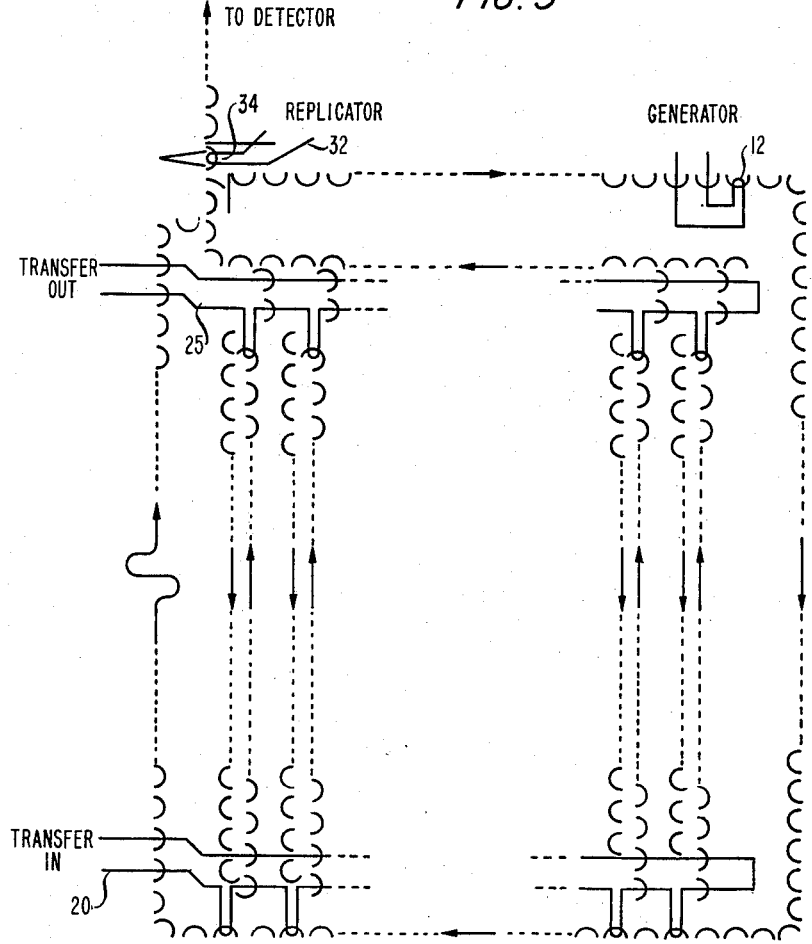
FIG. 3 is a top view of a portion of the memory of FIG. 1.

FIG. 3 shows the detail of a portion of an illustrative memory of the type shown in FIG. 1 implemented by the familiar asymmetric disc permalloy elements. Each element is represented by a U-shaped curve and the various functions are designated by name and number in the figure. The write operation as can be appreciated also from FIG. 3 is not initiated by a transfer-out operation. Rather, new data is written in before transfer-out occurs for reasons which will become clear. Thereafter, transfer-out occurs. Since new data is to be written into the vacancies created by that transfer, the data transferred out is not replicated at 34 into loop ML. The vacancies are filled by a later-occuring transfer-in pulse on conductor 20 as can be seen in the pulse diagram of FIG. 2.

Now we will turn our attention to the operation when a power failure occurs. Copending application, Ser. No. 960,948, filed Nov. 15, 1978 for P. I. Bonyhard describes some general consideration for power failure operation particularly with respect to master clock and address register functions herein. The serious loss of data in a bubble memory occurs when data are in the major loop when a power failure occurs as is noted in that application. The data are not really lost in the sense of being annihilated, only the correspondence between the data and the address and clock count is lost.

Data are secured in accordance with the present invention by adding portion 50 to, for example, what is thought of as a non-closed, G-shaped major path as shown in the embodiment of FIG. 1. Such a portion, of course, is useless during normal operation because both read and write operations end with a transfer-in operation. Thus, normally no data even pass the transfer-in locations coupled by conductor 20. On the other hand, if a power failure occurs, no transfer-in operation can occur afterwards. When power again comes on, the correspondence between the data in the major path and the occurrence of transfer-in pulse is lost. Data can only be moved off the major (non-closed) path with no hope of reclamation in the absence of portion 50.

A memory, in accordance with the present invention, includes a power monitor 51, between the normal power supply 52 and control circuit 15. When a power failure occurs, monitor 51 applies a power failure signal to control circuit 15. In response, circuit 15 stops propagation controllably, inhibiting any transfer operation and setting the master clock and address register to zero. Data are now secure in the major loop. When power is restored, that data normally move to the detector once a start command is applied to conductor 60 of FIG. 1. Replication at port 34 is initiated in response to the start command also to ensure the continued presence of the previously accessed data block in loop ML.

The algorithm for restarting the memory of FIG. 1 is as follows: The algorithm assumes there are M steps or stages in each minor loop, 3M stages in the circumferential major loop, B stages from the first transfer-out gate (at l₁) to detector 13 and C stages from the first transfer-out gate to the first transfer-in gate where $C \approx 1.5 M$. A block of data with address ($1 < a < M$) is transferred out on cycle a and reaches detector 13 on cycle $a+b$. The algorithm, further, presupposes a data block of K bits, where K equals the number of minor loops in the memory. Each data block is preceded by an address having $\log_2 M$ bits and is bracketed by a permanent binary one at each end.

RESTART ALGORITHM

1. Start propagation, replication and detection.
2. Find a "1" preceded by $\geq M$ "0"s.
3. Consider next $\log_2 M$ bits as the address a of data block in circumferential major loop when power failure occurred. Set master clock to a count of $B + \log_2 M + 1 + a$ on the cycle when the last bit of a is detected.
4. Check if last bit of block is "1". If not, return to step 2 above.
5. Check if there is a second block, M steps after present block, with the same address. If yes, annihilate (by inhibiting replication at 34) second block and return to step 2. If not, apply transfer-in pulse on cycle $a+c$ and then return to step 2.
6. If no more complete blocks are found in the major loop, annihilate any incomplete block there. Memory is now ready for use.

Note that on any but the first iteration the count to which the master clock is to be set in step 3 must be equal to the count already present. Also note that if a power failure occurs during a write operation, the terminal "1" at the end of the data block will be missing. Operation is such that a new block of data is completely written before the old block at the selected address is transferred out of the minor loops. The algorithm (step 4) can be seen to look for partial data blocks which would occur if a power failure coincides with a write operation. Step 5 of he algorithm looks for the old block following the complete new block and operates to annihilate it. FIG. 2 is consistent with this operation showing generate pulses under "generate enable"-prior to the transfer-out pulse. The purpose of the bracketing of bubbles at the ends of every block is to provide a recognizable code when a restore operation occurs after a power failure, as is clear from a glance at the restart algorithm.

Control circuit 15 of FIG. 1 is considered to include a microprocessor which can be programmed according to the above algorithm.

What has been described is considered merely illustrative of the principle of this invention. Accordingly, various modifications can be devised by those skilled in the art in accordance with those principles within the spirit and scope of the invention as encompassed by the following claims:

I claim:

1. A magnetic bubble memory comprising a layer of material in which magnetic bubbles can be moved along paths, a plurality of closed minor loops for recirculating bubble patterns synchronously between first and second ends, the memory being characterized by means for selectively adapting ones of the paths into a closed major loop such that a bubble traveling along the major loop passes the minor loops at the first and second ends in a like order.

2. A magentic bubble memory in accordance with claim 1 wherein said major loop comprises at least first and second paths for moving bubbles synchronously to a detector and means for selectively replicating bubbles from said first to said second path.

3. A magnetic bubble memory in accordance with claim 2 also including transfer-in and transfer-out gates at said first and second ends for transferring bubble patterns to said first path and from said second path respectively.

4. A magnetic bubble memory in accordance with claim 3 also including a power supply and power monitor means for conrollably terminating bubble propagation when a power failure occurs.

5. A magnetic bubble memory comprising a layer of material in which magnetic bubbles can be moved, a pattern of elements coupled to said layer for forming in said layer a plurality of closed-loop paths for recirculating bubbles thereabout between first and second ends, means for transferring data out of and into said closed-loop paths at said first and second ends respectively, said elements also forming an auxiliary path and a non-closed major path the latter of a geometry to move bubbles past said closed loops at said first and second ends in first and second orders, respectively, said auxiliary path being arranged to move bubbles therein to pass said first ends in said second order and terminating at a detector, said major path at said second ends having an additional portion merging with said auxiliary path for moving bubbles to said detector, and a replicator for selectively causing data to move from one of said auxiliary path and said additonal portion to the end of said major path at said first ends of said minor loops.

* * * * *